(12) United States Patent
Yi

(10) Patent No.: US 7,741,178 B2
(45) Date of Patent: Jun. 22, 2010

(54) METHOD FOR FABRICATING VERTICAL CHANNEL TRANSISTOR IN SEMICONDUCTOR DEVICE

(75) Inventor: Hong-Gu Yi, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 12/164,463

(22) Filed: Jun. 30, 2008

(65) Prior Publication Data
US 2009/0163027 A1 Jun. 25, 2009

(30) Foreign Application Priority Data
Dec. 24, 2007 (KR) ...................... 10-2007-0136513

(51) Int. Cl.
*H01L 21/336* (2006.01)
(52) U.S. Cl. ...................... 438/259; 438/700; 438/246; 438/270; 438/242; 257/339; 257/489; 257/302; 257/500
(58) Field of Classification Search ................. 438/138, 438/197, 700, 425–433, 259, 246, 270, 242; 257/339, 489, 302, 500
See application file for complete search history.

(56) References Cited
U.S. PATENT DOCUMENTS
5,541,122 A * 7/1996 Tu et al. ...................... 438/138
6,057,243 A * 5/2000 Nagayama .................. 438/700
6,486,039 B2 * 11/2002 Yoo et al. .................... 438/425
6,700,175 B1 * 3/2004 Kodama et al. ............. 257/489
7,371,627 B1 * 5/2008 Forbes ......................... 438/197

FOREIGN PATENT DOCUMENTS
| KR | 10-2005-0002424 | 1/2005 |
| KR | 10-2006-0041415 | 5/2006 |
| KR | 10-2007-0003019 | 1/2007 |
| KR | 10-2007-0056389 | 6/2007 |

OTHER PUBLICATIONS
Notice of Allowance dated Aug. 31, 2009, for Korean application No. 10-2007-0136513.

* cited by examiner

Primary Examiner—William M Brewster
Assistant Examiner—Wilner Jean Baptiste
(74) Attorney, Agent, or Firm—Lowe Hauptman Ham & Berner LLP

(57) ABSTRACT

A method for fabricating a vertical channel transistor in a semiconductor device includes forming a plurality of pillars arranged in a first direction and a second direction crossing the first direction over a substrate, wherein each of the pillars includes a hard mask pattern thereon, forming a bit line region in the substrate between the pillars, forming a first sidewall insulation layer on a sidewall of each of the pillars, forming an insulation layer for filling a space between the pillars, forming a mask pattern for exposing the substrate between lines of the pillars arranged in the first direction over a resulting structure including the insulation layer, etching the insulation layer and the substrate using the mask pattern as an etch barrier to form a trench for defining a bit line in the substrate, and forming a second sidewall insulation layer over a resulting structure including the trench.

16 Claims, 8 Drawing Sheets

METHOD FOR FABRICATING VERTICAL CHANNEL TRANSISTOR IN SEMICONDUCTOR DEVICE

CROSS-REFERENCE TO RELATED APPLICATIONS

The present invention claims priority of Korean patent application number 10-2007-0136513, filed on Dec. 24, 2007, which is incorporated by reference in its entirety.

BACKGROUND OF THE INVENTION

The present invention relates to a method for fabricating a semiconductor device, and more particularly, to a method for fabricating a vertical channel transistor in a semiconductor device.

As an integration degree of a semiconductor device increases, a transistor having smaller feature sizes is necessitated. For example, it is required that a transistor of a dynamic random access memory (DRAM) device has a device area of approximately $8F^2$ (F: minimum feature size) or less, preferably approximately $4F^2$. However, it is difficult to satisfy the required device area because of the present planar transistor structure in which a gate electrode is formed on a substrate, and junction regions are formed at both sides of the gate electrode. As a result, a vertical channel transistor structure has been proposed.

FIG. 1 illustrates a perspective view of a typical vertical channel transistor structure.

Referring to FIG. 1, a plurality of pillars P is formed on a substrate 10. The pillars P are formed of a substrate material and arranged in a first direction (X-X') and a second direction (Y-Y') crossing the first direction.

Buried bit lines 11 are formed in the substrate 10 between the respective pillars P arranged in the first direction. The buried bit lines 11 surround the pillars P and extend in the first direction. The buried bit lines 11 are isolated from each other by a device isolation trench T.

A surround type gate electrode (not shown) surrounding each of the pillars P is formed on an outer circumference of each pillar P. A word line 12, which is electrically connected to the surround type gate electrode and which extends in the second direction is formed on the outer circumference of the pillar P.

However, there is a limitation in a typical process for forming the buried bit line 11, resulting in an inferior device. Hereinafter, a typical method for fabricating the vertical channel transistor in the substrate and the limitation thereof will be described in detail with reference to FIGS. 2A and 2B.

FIGS. 2A and 2B illustrate a method for fabricating a typical vertical channel transistor in a semiconductor device and a limitation thereof. Particularly, FIGS. 2A and 2B illustrate cross-sectional views taken along line Y-Y' of FIG. 1, i.e., the second direction.

Referring to FIG. 2A, a substrate structure which includes a substrate 20, a hard mask pattern 21, and a surround type gate electrode 22 is shown. The substrate 20 includes a plurality of pillars P arranged in a first direction and a second direction crossing the first direction. The hard mask pattern 21 is used to form the pillars P and is formed on each of the pillars P. The surround type gate electrode 22 surrounds a lower portion of each of the pillars P. Although not shown, a nitride layer is formed on a sidewall of the pillar P. The nitride layer serves as an etch barrier during a self-aligned contact (SAC) etching process for forming a following word line to protect the pillar P against an etching attack in a subsequent process.

Impurity ions are doped in the substrate 20 between the pillars P to form a bit line impurity region 23. An insulation layer 24 is deposited on a resulting structure, and the deposited insulation layer 24 is planarized until the hard mask pattern 21 is exposed.

Mask patterns 25 for forming a device isolation trench T are formed on the planarized resulting structure. The bit line impurity region 23 is divided by the device isolation trench T to form bit lines. The mask patterns 25 have a line-and-space pattern shape so that the substrate 20 between lines of the pillars P arranged in the first direction is exposed. A space width Ws between the mask patterns 25 is narrower than a space width $W_P$ between the lines of the pillars P arranged in the first direction by a predetermined amount.

Referring to FIG. 2B, the exposed insulation layer 24 and the substrate 20 formed below the insulation layer 24 are etched to a predetermined depth using the mask pattern 25 as an etch barrier to form the device isolation trench T extending in a direction parallel to the first direction in the substrate 20 between the lines of the pillars P arranged in the first direction. The device isolation trench T is formed with a depth penetrating the bit line impurity region 23 to form a buried bit line 23A surrounding the pillars P and extending in the first direction. A reference numeral 20A and a reference numeral 24A denote an etched substrate and an etched insulation layer after the etch process, respectively.

As semiconductor devices are highly integrated and patterns are micronizated, misalignment of the mask pattern 25 used to form the buried bit line 23A frequently occurs, resulting in unnecessary loss of the nitride layer formed on the sidewall of the pillar P in the etch process for forming the device isolation trench T (see FIG. 3). As a result, the pillar P is attacked in the subsequent process (for example, a word line forming process) due to such the loss of the nitride layer formed on the sidewall of the pillar P. Therefore, it is required to develop techniques capable of protecting the pillar P against the etching attack in the subsequent process even if the misalignment of the mask pattern 25 occurs.

SUMMARY OF THE INVENTION

Embodiments of the present invention contemplate a method for fabricating a vertical channel transistor of a semiconductor device in which an additional process for compensating loss of a nitride layer formed on a sidewall of a pillar is performed after a formation of a device isolation trench to protect the pillar against an etching attack in a subsequent process even if misalignment of mask patterns occurs.

In accordance with an embodiment of the present invention, there is provided a method for fabricating a vertical channel transistor in a semiconductor device. The method includes forming a plurality of pillars arranged in a first direction and a second direction crossing the first direction over a substrate, wherein each of the pillars includes a hard mask pattern thereon, forming a bit line region in the substrate between the pillars, forming a first sidewall insulation layer on a sidewall of each of the pillars, forming an insulation layer for filling a space between the pillars, forming a mask pattern for exposing the substrate between lines of the pillars arranged in the first direction over a resulting structure including the insulation layer, etching the insulation layer and the substrate using the mask pattern as an etch barrier to form a trench for defining a bit line in the substrate, and forming a second sidewall insulation layer over a resulting structure including the trench.

DESCRIPTION OF SPECIFIC EMBODIMENTS

In the following detailed description, for purposes of explanation, numerous specific details are set forth in order to provide a thorough understanding of the present invention. It will be apparent, however, that the present invention may be practiced without these specific details. Hereinafter, a method for fabricating a vertical channel transistor in a semiconductor device in accordance with the embodiments of the present invention will be described in detail with reference to the accompanying drawings.

It will be understood that when an element such as a layer, a film, a pattern and a region is referred to as being 'on/under' another element herein, it may be directly on/under the other element, and one or more intervening elements may also be present.

Figure 1:
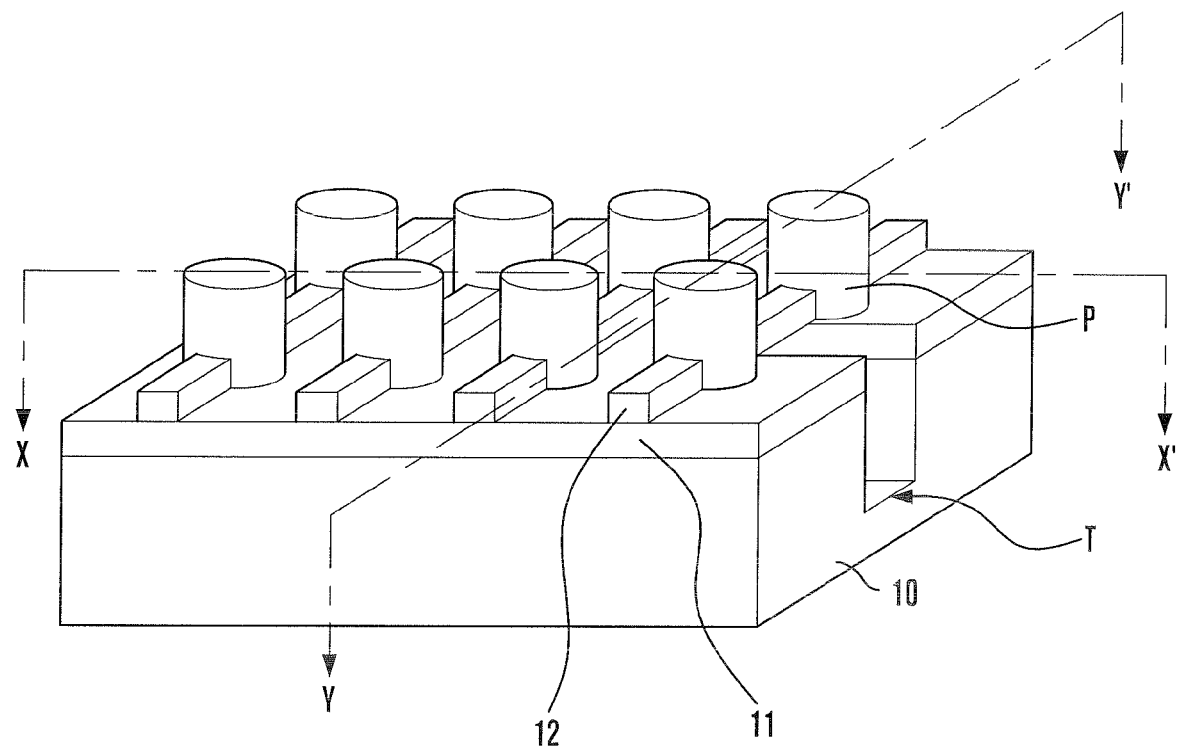
FIG. 1 illustrates a perspective view of a typical vertical channel transistor structure.
Figure 2A:
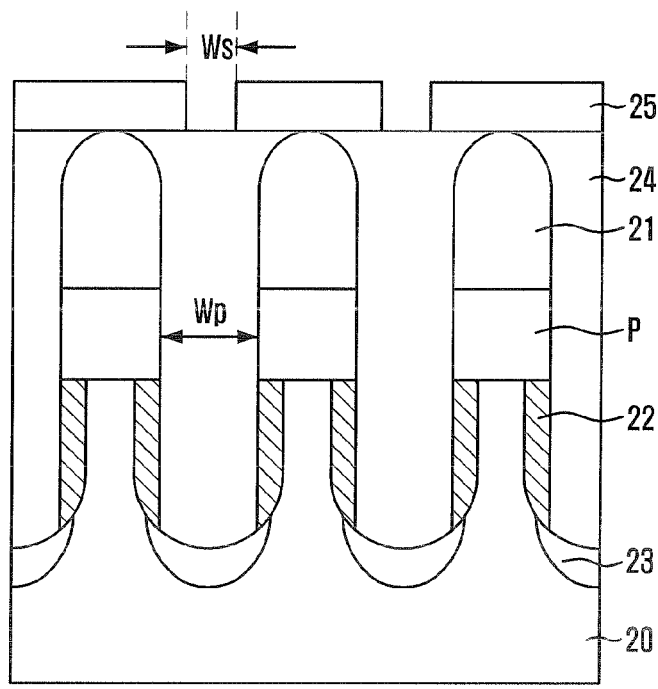
FIGS. 2A and 2B illustrate a method for fabricating a typical vertical channel transistor in a semiconductor device and a limitation thereof.
Figure 2B:
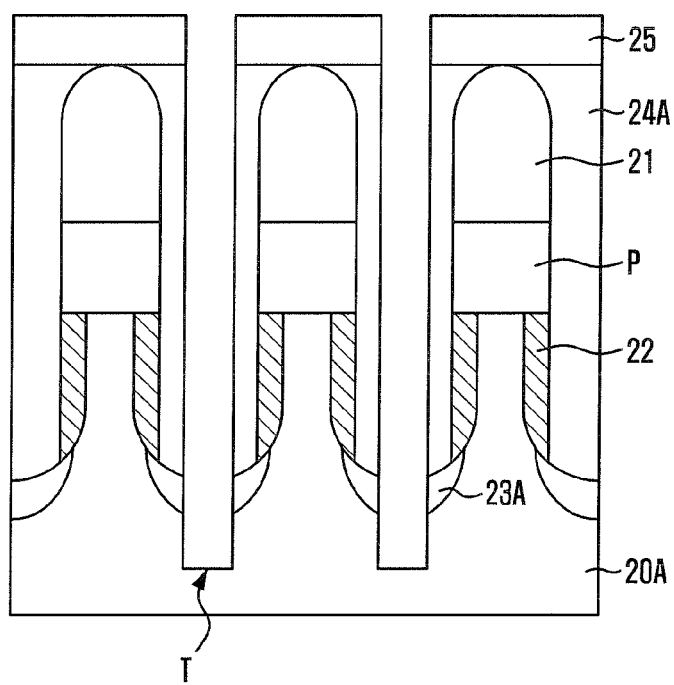
Figure 3:
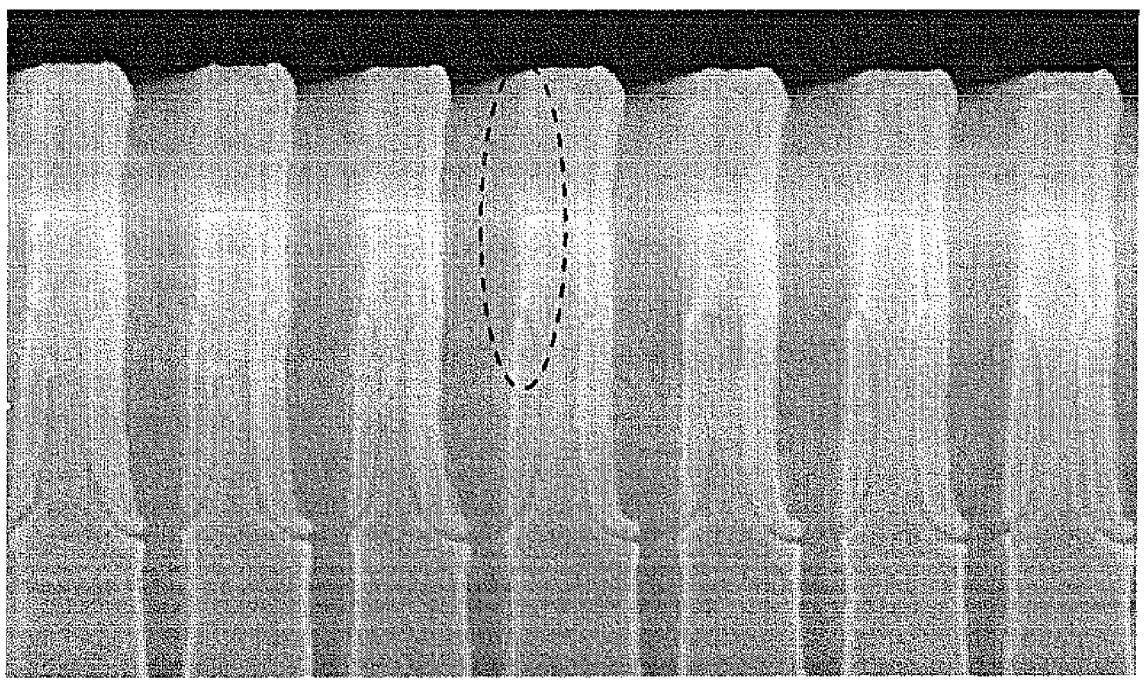
FIG. 3 illustrates a micrographic view showing the limitation of the method for fabricating the typical vertical channel transistor in the semiconductor device.

FIGS. 4A to 4E illustrate a method for fabricating a vertical channel transistor in a semiconductor device in accordance with an embodiment of the present invention. Particularly, FIGS. 4A to 4E illustrate cross-sectional views taken along line Y-Y' of FIG. 1, i.e., a second direction.

Figure 4A:
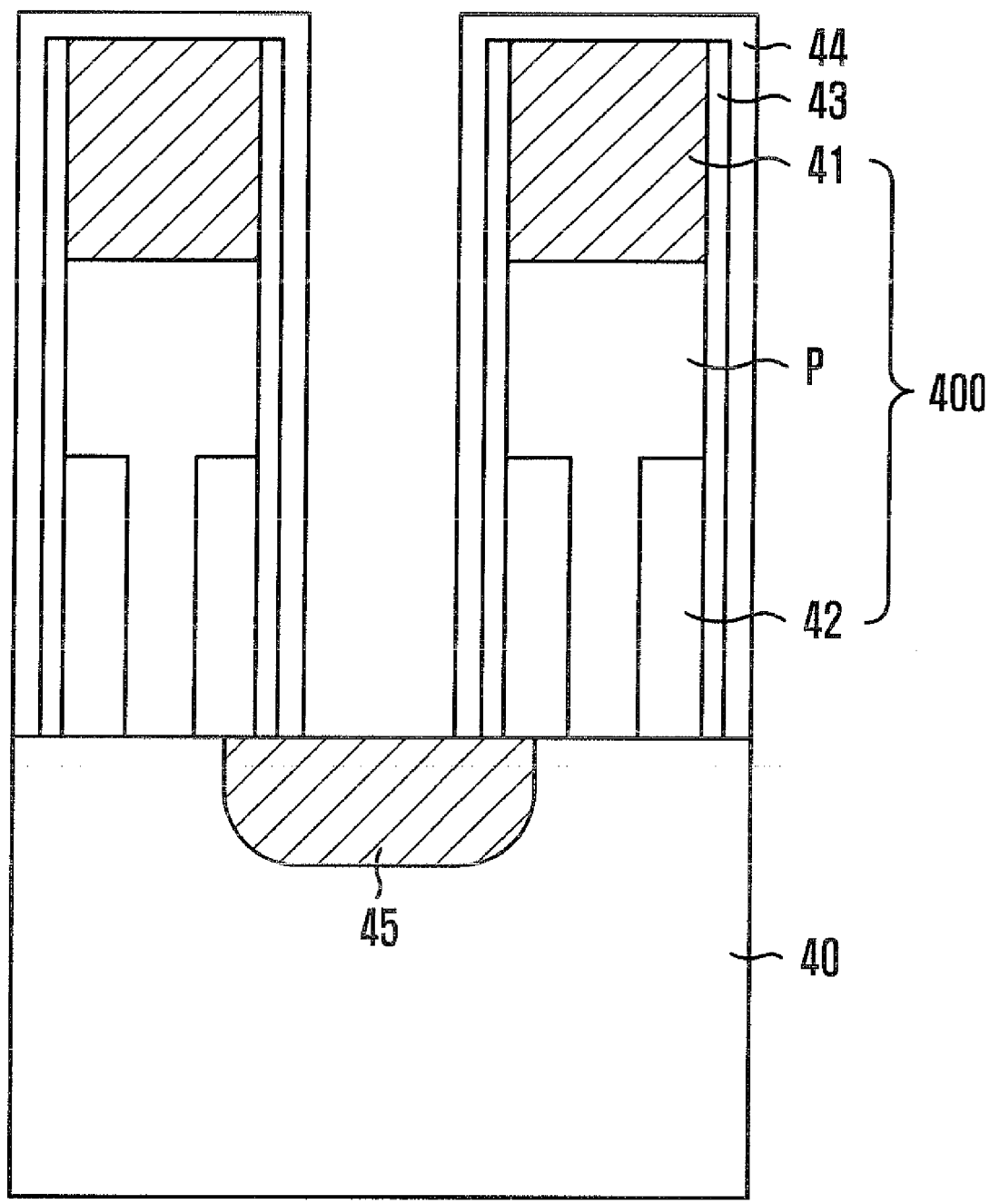
FIGS. 4A to 4E illustrate a method for fabricating a vertical channel transistor in a semiconductor device in accordance with the embodiments of the present invention.

Referring to FIG. 4A, a hard mask pattern 41 for forming pillars P is formed on a substrate 40. The substrate 40 is etched to a predetermined depth using the hard mask pattern 41 as an etch barrier to form the pillars P. The pillar P is formed of a material same as the substrate 40. It is also within the scope of the invention that the hard mask pattern 41 includes a nitride layer. A pad oxide layer (not shown) may be formed below the hard mask pattern 41. A lower portion of each of pillars P is recessed by a predetermined width. Further, a surround type gate electrode 42 surrounding the recessed lower portion of the pillar P is formed.

A vertical gate structure 400 includes the pillar P, the hard mask pattern 41 formed on the pillar P, and the surround type gate electrode 42 surrounding the recessed lower portion of the pillar P.

A first nitride layer 44 is formed on a top portion and a sidewall of the vertical gate structure 400 in order to protect the pillar P against an etching attack in a subsequent process. A sidewall oxide layer 43 may be further interposed between a sidewall of the vertical gate structure 400 and the first nitride layer 44. Impurity ions are doped into the substrate 40 between the pillars P to form a bit line impurity region 45.

Figure 4B:
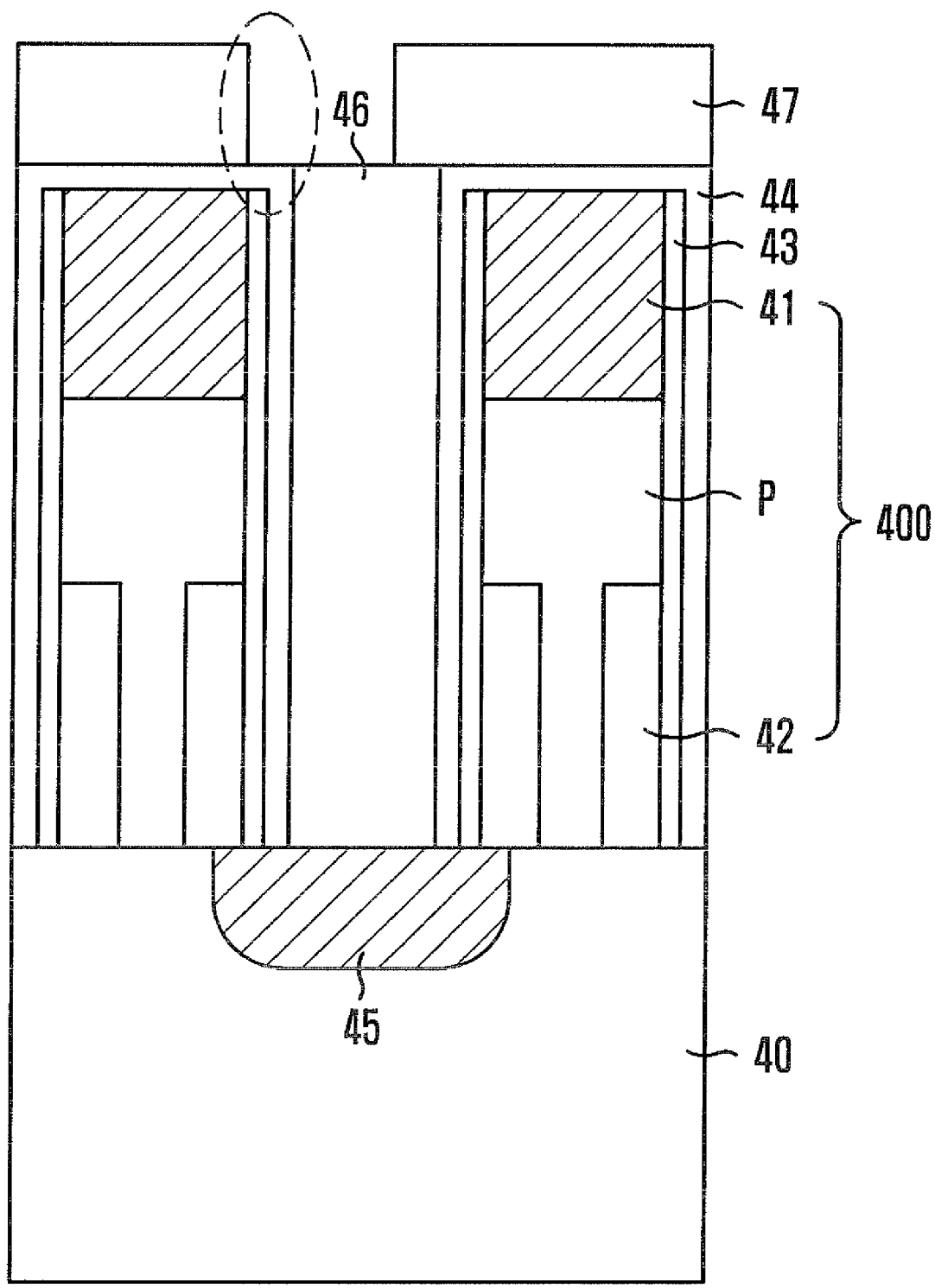

Referring to FIG. 4B, an oxide layer 46 is formed on the resulting structure, and then the oxide layer 46 is planarized until the first nitride layer 44 is exposed. For example, such a planarization process may be performed through a chemical mechanical planarization (CMP) process.

A mask pattern 47 for forming a device isolation trench T and a bit line is formed on the planarized resulting structure. The mask pattern 47 has a line-and-space pattern shape so that the substrate 40 between lines of the pillars P arranged in the first direction is exposed. As illustrated by dotted line in FIG. 4B, the mask pattern 47 may be misaligned to expose a portion of the first nitride layer 44.

Figure 4C:
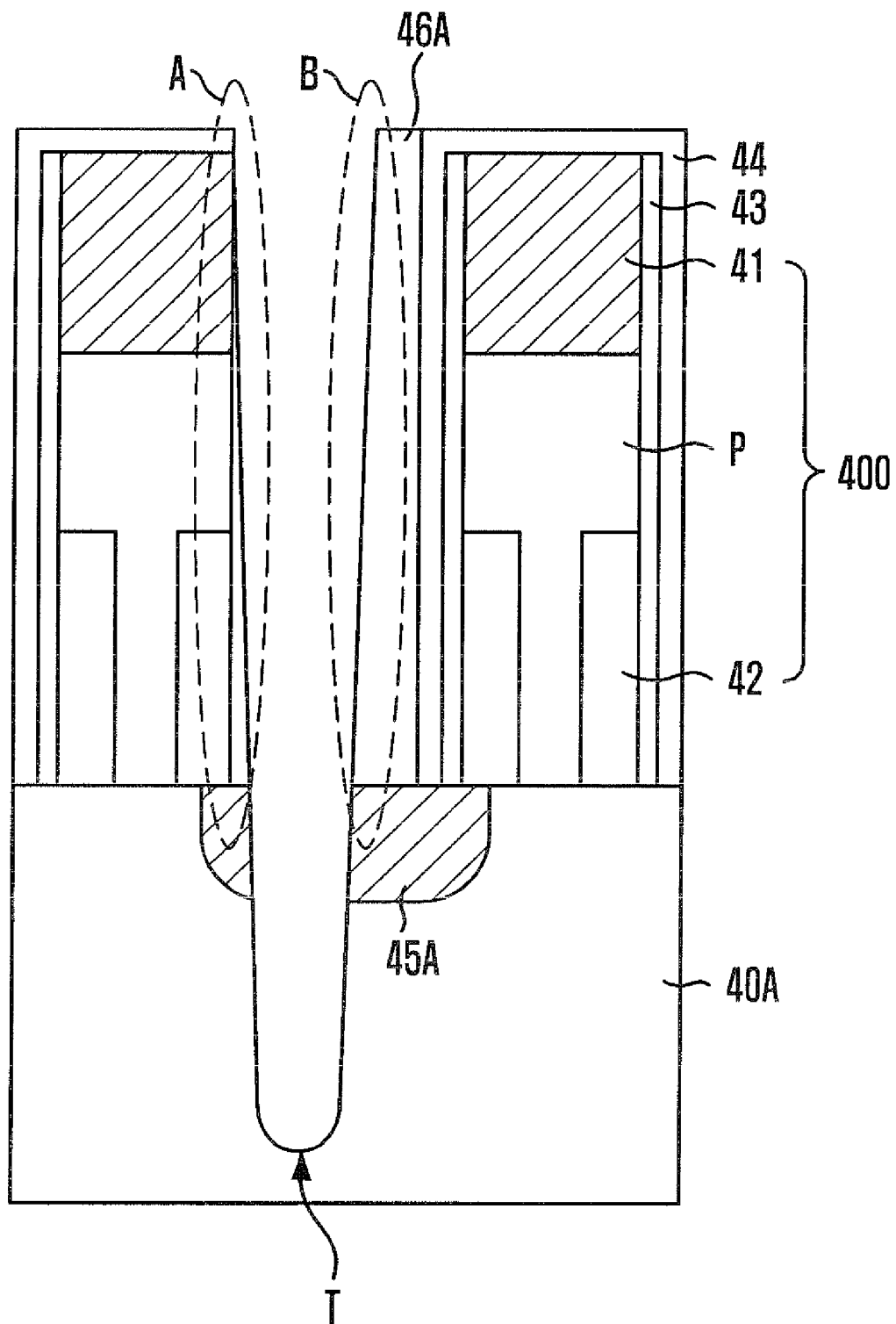

Referring to FIG. 4C, the exposed oxide layer 46 and the substrate 40 below the oxide layer 46 are dry etched to a predetermined depth using the mask patterns 47 as the etch barrier to form the device isolation trench T extending in a direction parallel to the first direction in the substrate 40 between the lines of the pillars P arranged in the first direction. The device isolation trench T is formed with a depth penetrating the bit line impurity region 45 to form a buried bit line 45A surrounding the pillars P and extending in the first direction. In such a process, the portion of the first nitride layer 44 exposed due to the misalignment of the mask patterns 47 may be lost (see a reference symbol "A" in FIG. 4C). Hence, there is required a subsequent process through which the loss of the first nitride layer 44 can be compensated.

Although the loss of the first nitride layer 44 can be compensated through the subsequent process, the loss of the first nitride layer 44 should be minimized during the etch process for forming the device isolation trench T. It is also within the scope of the invention that the dry etching process be performed using a self-aligned contact (SAC) etching process that utilizes a difference in etching selectivity between the oxide layer and the nitride layer. Further, carbon fluoride (CF)-based gases (for example, $C_4F_6$, $C_5F_8$, $C_4F_8$, $C_3F_8$, etc) that can enhance a polymer formation are used as an etch gas. A reference numeral 40A and a reference numeral 46A denote an etched substrate and an etched oxide layer during the formation of the trench T, respectively.

Figure 4D:
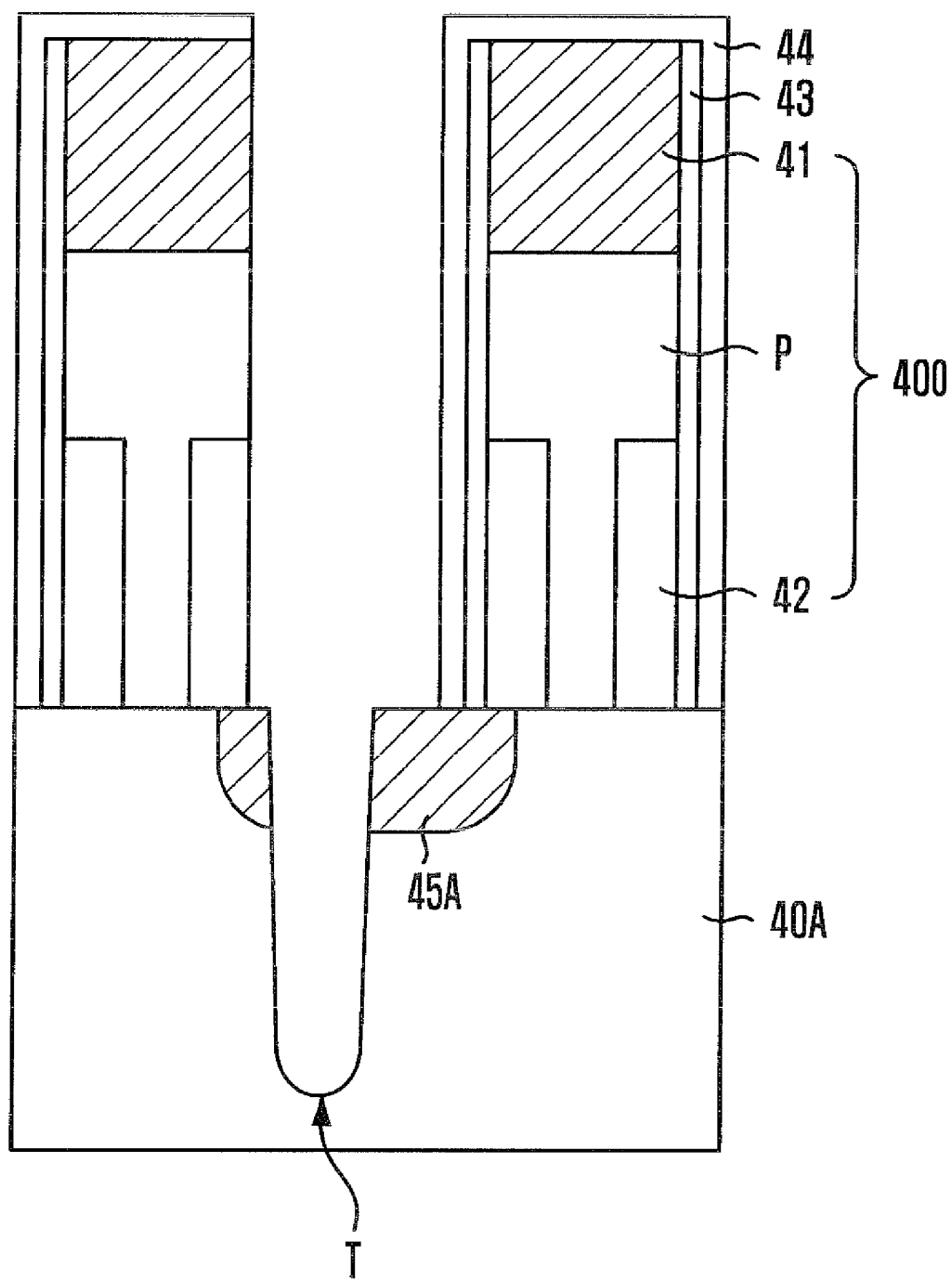

Referring to FIG. 4D, the remaining oxide layers, i.e., the etched oxide layer 46A and the exposed sidewall oxide layer 43, are removed before the subsequent process is performed to compensate the losses of the first nitride layer 44. The reason why such a process is performed is to easily remove sidewall layers that must be removed in the subsequent processes. If the oxide layer removing process illustrated in FIG. 4D is not performed, an etch process is normally performed in the subsequent process through which the loss of the first nitride layer 44 can be compensated. This causes a quadruple layer structure of oxide/nitride/oxide/nitride layers to be formed on a portion of the sidewall of the vertical gate structure 400 in which the loss of the first nitride layer 44 does not occur (see a reference symbol "B" in FIG. 4C). Hence, the remaining oxide layers to be removed are not easily removed in the subsequent process. To easily remove the remaining oxide layers, the removing process of the remaining oxide layers is performed to form a dual layer structure of oxide/nitride layers or a single layer structure of a nitride layer on the sidewall of the vertical gate structure 400. Hence, the remaining oxide layers to be removed are easily removed in the subsequent process. Further, the oxide layer removing process is performed through a wet etching process using hydrofluoric acid (HF) solution or buffered oxide etchant (BOE) solution or an isotropic dry etching process in order to protect the pillars P and the nitride layer against the etching attack in the subsequent process.

Figure 4E:
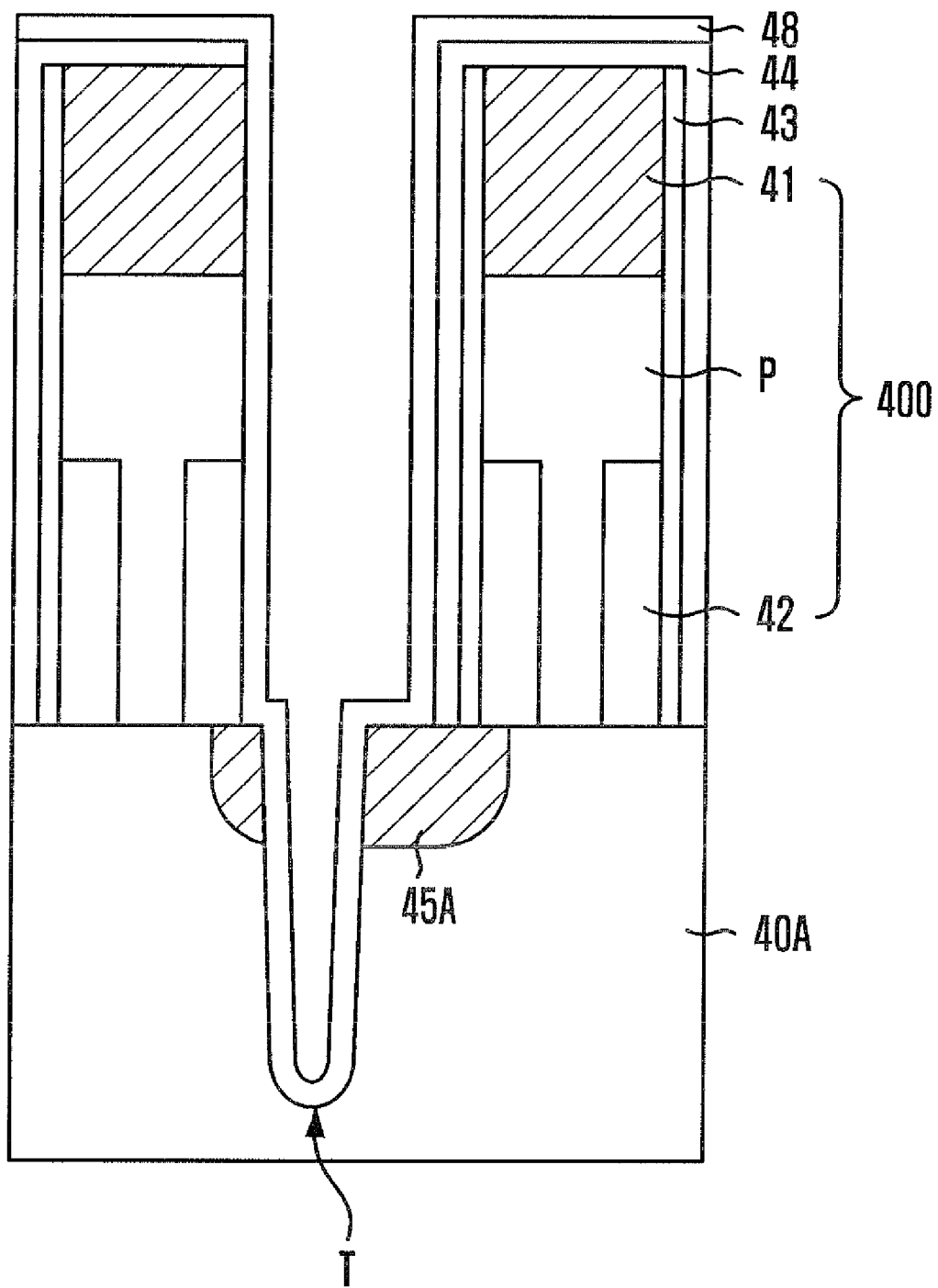

Referring to FIG. 4E, a second nitride layer 48 is formed on an entire surface of the resulting structure to protect the first nitride layer 44 from being lost due to the misalignment of the mask patterns 47. Therefore, the pillars P can be protected in the subsequent process (for example, the SAC etching process for forming a word line). Further, the first nitride layer 44 includes a thermal nitride layer in which a thickness thereof is easily controlled and a step coverage characteristic is improved.

Although not shown, the word line (not shown), which is connected to the surround type gate electrode 42 and extends in a second direction, is formed, and the sidewall layers (the sidewall layer 43, the first nitride layer 44, and the second nitride layer 48, remaining after a wet cleaning process is performed, are removed in a subsequent process.

While the present invention has been described with respect to the disclosed embodiments, the above embodiments of the present invention are illustrative and not limitative. It will be apparent to those skilled in the art that various changes and modifications may be made without departing from the spirit and scope of the invention as defined in the following claims.

What is claimed is:

1. A method of fabricating a vertical channel transistor in a semiconductor device, the method comprising:
    forming a plurality of pillars arranged in rows and columns respectively in a first direction and a second direction crossing the first direction over a substrate, wherein each of the pillars includes a hard mask pattern thereon;
    forming a bit line region in the substrate between the adjacent pillars;
    forming a first sidewall insulation layer over a first resulting structure including the pillars to cover tops and sidewalls of the pillars;
    filling an insulation layer in a space between the adjacent pillars;
    forming a mask pattern over a second resulting structure including the insulation layer;
    etching the insulation layer and the substrate using the mask pattern as an etch barrier to form a trench, between the adjacent rows of the pillars arranged in the first direction, for defining a bit line in the substrate; and
    forming a second sidewall insulation layer over a third resulting structure including the trench to cover (i) the first sidewall insulation layer on the tops of the pillars and (ii) sidewalls of the trench.

2. The method of claim 1, after the forming of the trench, further comprising removing a residue of the insulation layer remaining after etching the insulation layer.

3. The method of claim 1, wherein the first sidewall insulation layer and the second sidewall insulation layer comprise nitride layers, and the insulation layer comprises an oxide layer.

4. The method of claim 3, further comprising
    depositing a sidewall oxide layer on the sidewalls of each of the pillars before forming the first sidewall insulation layer on said sidewall oxide layer.

5. The method of claim 2, wherein the first sidewall insulation layer and the second sidewall insulation layer comprise nitride layers, and the insulation layer comprises an oxide layer.

6. The method of claim 5, further comprising depositing a sidewall oxide layer on the sidewalls of each of the pillars before forming the first sidewall insulation layer on said sidewall oxide layer.

7. The method of claim 1, wherein the forming of the trench is performed using a self-aligned contact (SAC) etching process.

8. The method of claim 1, wherein the forming of the trench is performed using carbon fluoride (CF)-based gases.

9. The method of claim 2, wherein the removing of the residue of the insulation layer is performed using a wet etching process or an isotropic dry etching process.

10. The method of claim 9, wherein the wet etching process is performed using a hydrofluoric acid (HF) solution or buffered oxide etchant (BOE) solution.

11. The method of claim 6, wherein the removing of the residue of the insulation layer comprises removing the sidewall oxide layer exposed due to the forming of the trench.

12. The method of claim 1, wherein the second sidewall insulation layer comprises a thermal nitride layer.

13. The method of claim 1, wherein the forming of the insulation layer comprises:
    forming the insulation layer over a fourth resulting structure including the pillars and the first sidewall insulation layer; and
    planarizing the insulation layer until the first sidewall insulation layer is exposed.

14. The method of claim 1, after the forming of the pillars, further comprising:
    recessing a lower portion of each of the pillars to a predetermined width; and
    forming a surrounding type gate electrode in the recessed portion to surround the lower portion of each of the pillars.

15. The method of claim 1, wherein the bit line region is formed by doping impurity ions in the substrate.

16. The method of claim 1, wherein the bit line region is divided by the trench.

* * * * *